United States Patent
Chen et al.

[11] Patent Number: 5,935,705
[45] Date of Patent: Aug. 10, 1999

[54] CRYSTALLINE $SI_XC_YN_Z$ WITH A DIRECT OPTICAL BAND GAP OF 3.8 EV

[75] Inventors: Li-Chyong Chen; Kuei-Hsien Chen, both of Taipei; Dhananjay Manohar Bhusari, Yung-Ho; Yang-Fang Chen, Taipei; Ying-Sheng Huang, Yung-Ho, all of Taiwan

[73] Assignee: National Science Council of Republic of China, Taipei, Taiwan

[21] Appl. No.: 08/950,662

[22] Filed: Oct. 15, 1997

[51] Int. Cl.[6] .......................... H01L 31/00; C01B 33/00; C23C 16/00; B32B 9/00
[52] U.S. Cl. .......................... 428/367; 136/256; 136/258; 136/261; 423/324; 427/249; 427/255.2; 428/367
[58] Field of Search .......................... 423/324; 427/255.2, 427/249; 136/256, 258, 261; 428/367

[56] References Cited

U.S. PATENT DOCUMENTS

| | | | |
|---|---|---|---|
| 3,394,991 | 7/1968 | Evans | 23/191 |
| 3,565,674 | 2/1971 | Boland et al. | 117/106 |
| 3,937,792 | 2/1976 | Lumby | 423/344 |
| 4,022,872 | 5/1977 | Carson et al. | 423/297 |
| 4,117,095 | 9/1978 | Komeya et al. | 423/344 |
| 4,118,539 | 10/1978 | Hirai et al. | 428/446 |
| 4,122,155 | 10/1978 | Prochazka et al. | 423/344 |
| 4,147,584 | 4/1979 | Garrison et al. | 156/612 |
| 4,280,989 | 7/1981 | Seimiya et al. | 423/344 |
| 4,393,097 | 7/1983 | Hirai et al. | 427/94 |
| 4,476,346 | 10/1984 | Tawada et al. | 136/249 |
| 4,499,331 | 2/1985 | Hamakawa et al. | 136/258 |
| 4,504,518 | 3/1985 | Ovshinsky et al. | 427/38 |
| 4,710,786 | 12/1987 | Ovshinsky et al. | 357/2 |
| 5,204,138 | 4/1993 | Nguyen et al. | 427/578 |
| 5,234,609 | 8/1993 | Kashida et al. | 252/1 |
| 5,242,530 | 9/1993 | Batey et al. | 156/613 |

*Primary Examiner*—Gary P. Straub
*Assistant Examiner*—Cam N. Nguyen
*Attorney, Agent, or Firm*—Bacon & Thomas, PLLC

[57] ABSTRACT

The present invention provides a novel crystalline material $Si_xC_yN_z$ possessing a direct optical band gap of 3.8 eV. Many optoelectronic applications, such as blue light emitting diode and laser diode, may utilize this property.

12 Claims, 6 Drawing Sheets

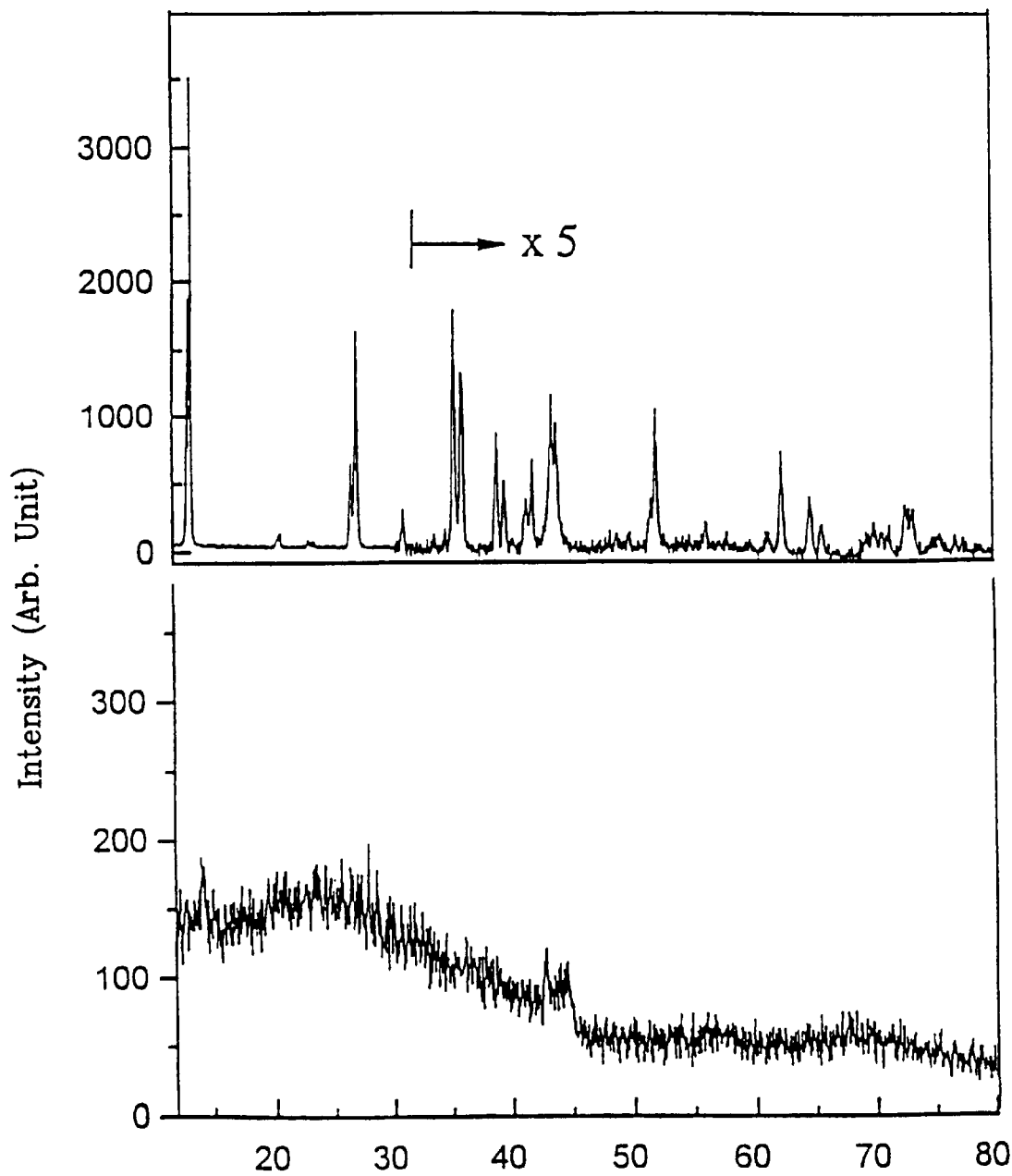

Raman Shift (CM$^{-1}$)

Wavenumber (CM$^{-1}$)

＃ CRYSTALLINE $Si_xC_yN_z$ WITH A DIRECT OPTICAL BAND GAP OF 3.8 EV

BACKGROUND OF THE INVENTION

1. Field of the Invention

The present invention provides a novel crystalline material $Si_xC_yN_z$ possessing a direct optical band gap of 3.8 eV. Many optoelectronic applications, such as blue light emitting diode and laser diode, may utilize this property.

2. Description of the Prior Art

Although Si (indirect optical band gap of 1.1 eV) and GaAs (direct optical band gap of 1.45 eV) have been widely accepted today as basic semiconductor materials for fabrication of a large variety of electronic devices, the inability to tailor their optical band gaps prevents these materials being used for many other applications, especially those requiring high band gaps. The most outstanding example of such application is the fabrication of semiconductor Light Emitting Diodes (LEDs) and Lasers, spanning the whole visible range (1.8 eV to 4.0 eV). The materials to be used as lasers and LEDs necessarily require a direct optical band gap of appropriate energy, for efficient conversion of electrical energy into light energy. Notably, several semiconductor materials with direct band gaps between 1.45 eV to 2.8 eV have been developed, and have already been put into commercial applications, nevertheless, suitable semiconductor materials with direct band gap above 3.0 eV have yet to be commercialized. It has therefore been a major research area in the field of material science to develop materials with optical band gaps of larger than 3.0 eV. Towards this end, GaN as well as its alloys such as AlGaN and InGaN have exhibited great promise. However, commercial production of electronic devices based on these materials has still not been possible, owing to the several problems associated with these materials. It is therefore believed to be still pertinent to explore new materials for applications requiring high optical band gaps.

SUMMARY OF THE INVENTION

The present invention provides a novel crystalline semiconductor material, viz. an alloy of Si, C and N, possessing a direct optical band gap of 3.8 eV.

BRIEF DESCRIPTION OF THE DRAWINGS

The invention, as well as its many advantages, may be further understood by the following description and drawings in which:

Table 1 shows the comparison of Raman vibrational frequencies of $\alpha$-$Si_3N_4$* and $Si_xC_yN_z$.

Table 2 shows the comparison of Infrared absorption frequencies of $\alpha$-$Si_3N_4$* and $Si_xC_yN_z$.

FIG. 1 X-ray diffraction spectrum of (A) polycrystalline $Si_xC_yN_z$ film and (B) amorphous $Si_xC_yN_z$ films.

Figure 2A:
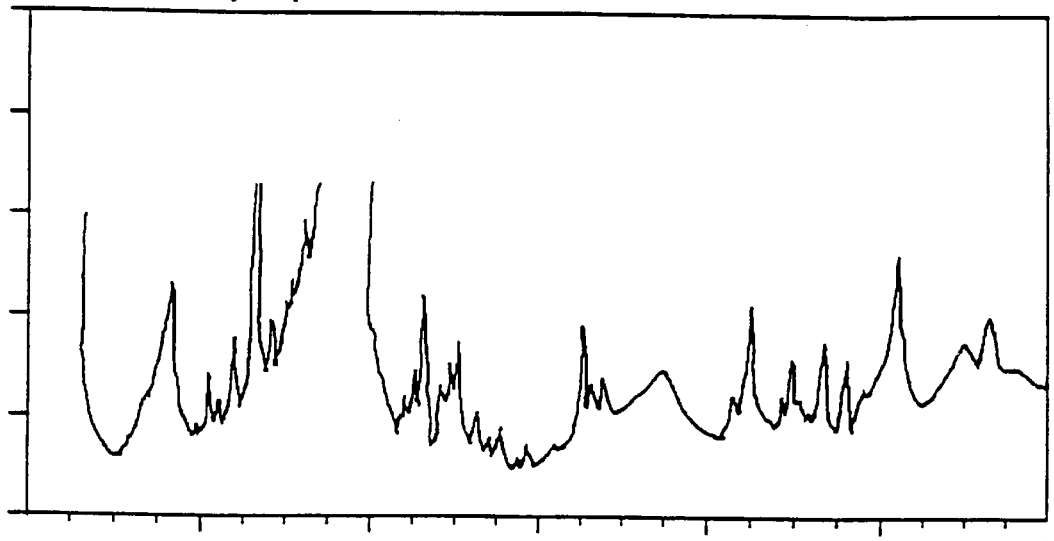

FIGS. 2(a), (b), (c) shown $\beta$-$Si_3N_4$, $\alpha$-$Si_3N_4$ and SiCN crystal of the present invention of Raman spectrum.

Figure 3A:
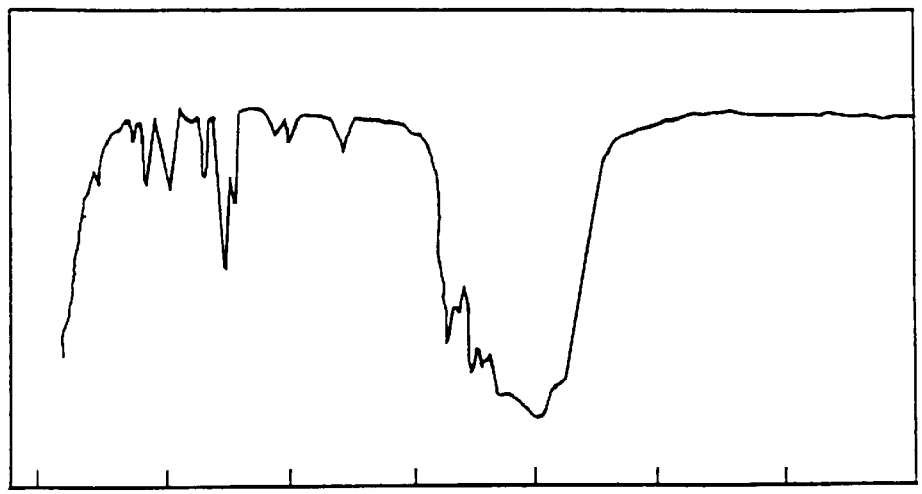
Figure 3B:
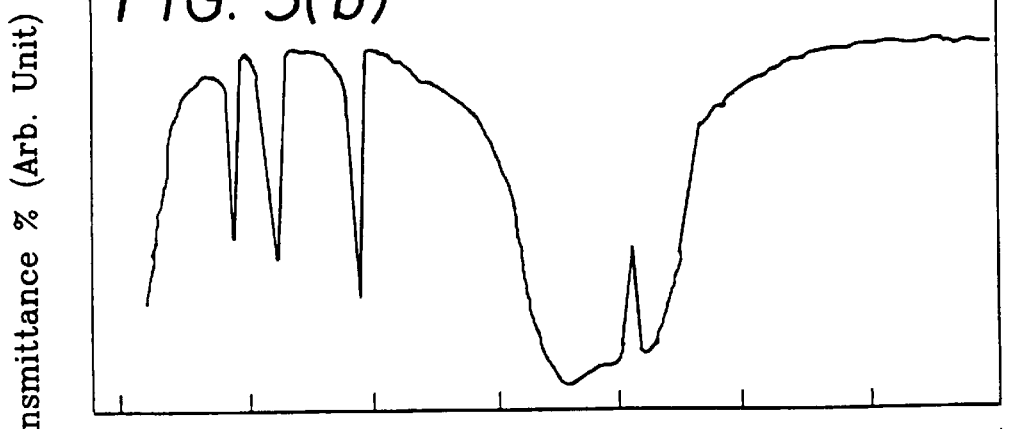
Figure 3C:
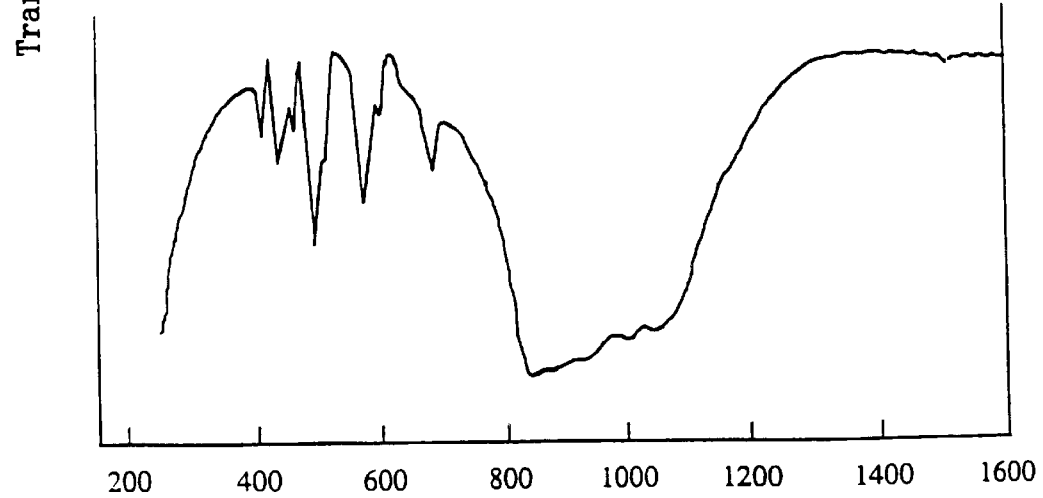

FIG. 3 are the IR absorption spectrum of (a) $\alpha$-$Si_3N_4$ (b) $\beta$-$Si_3N_4$ (c) SiCN.

Figure 4:
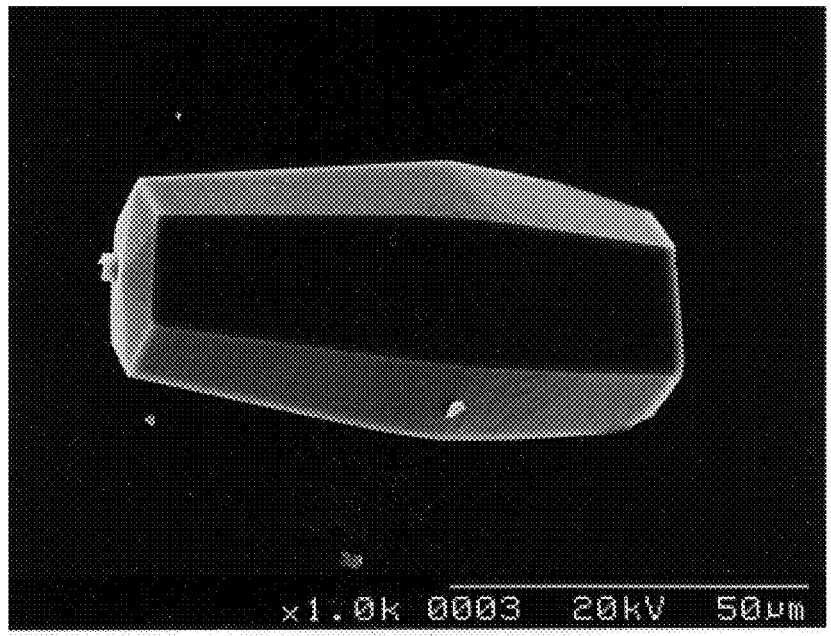
Figure 5:
Figure 6:
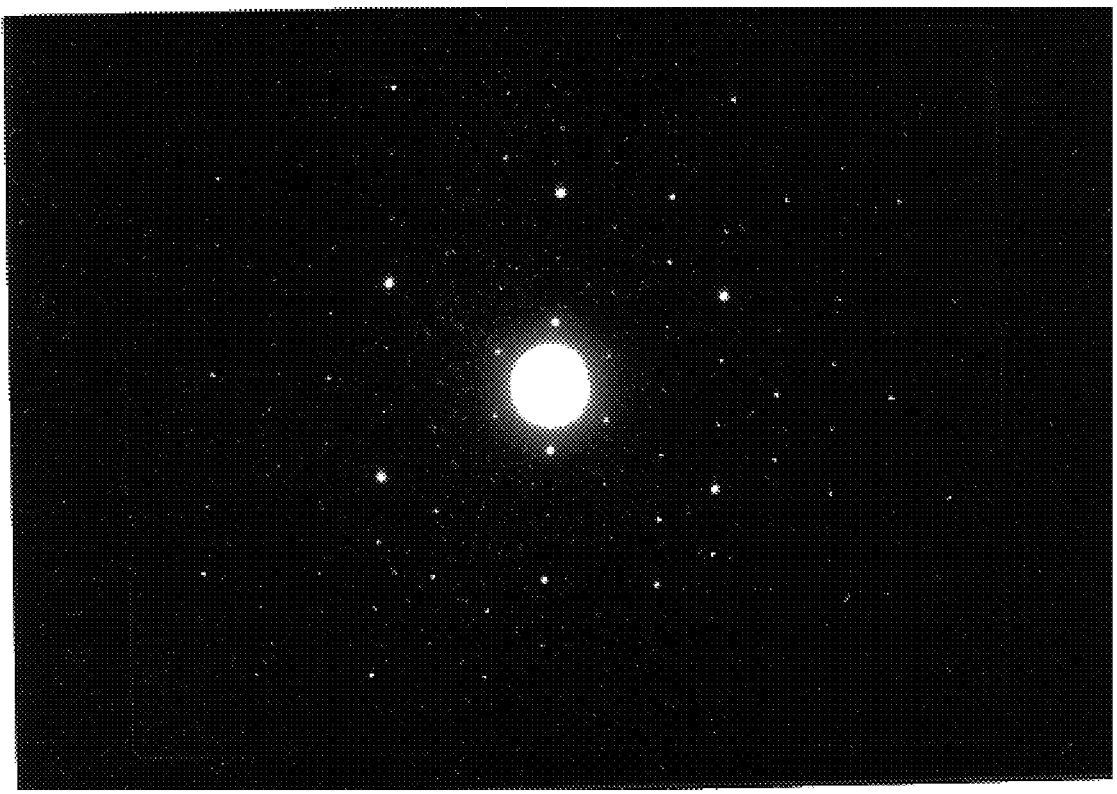

FIG. 4 shows the SME micrograph of a typical $Si_xC_yN_z$ crystal;

FIG. 5 shows the SME micrograph of a continuous polycrystalline $Si_xC_yN_z$ films;

FIG. 6 Transmission electron diffraction pattern of a typical $Si_xC_yN_z$ crystals.

Figure 7:
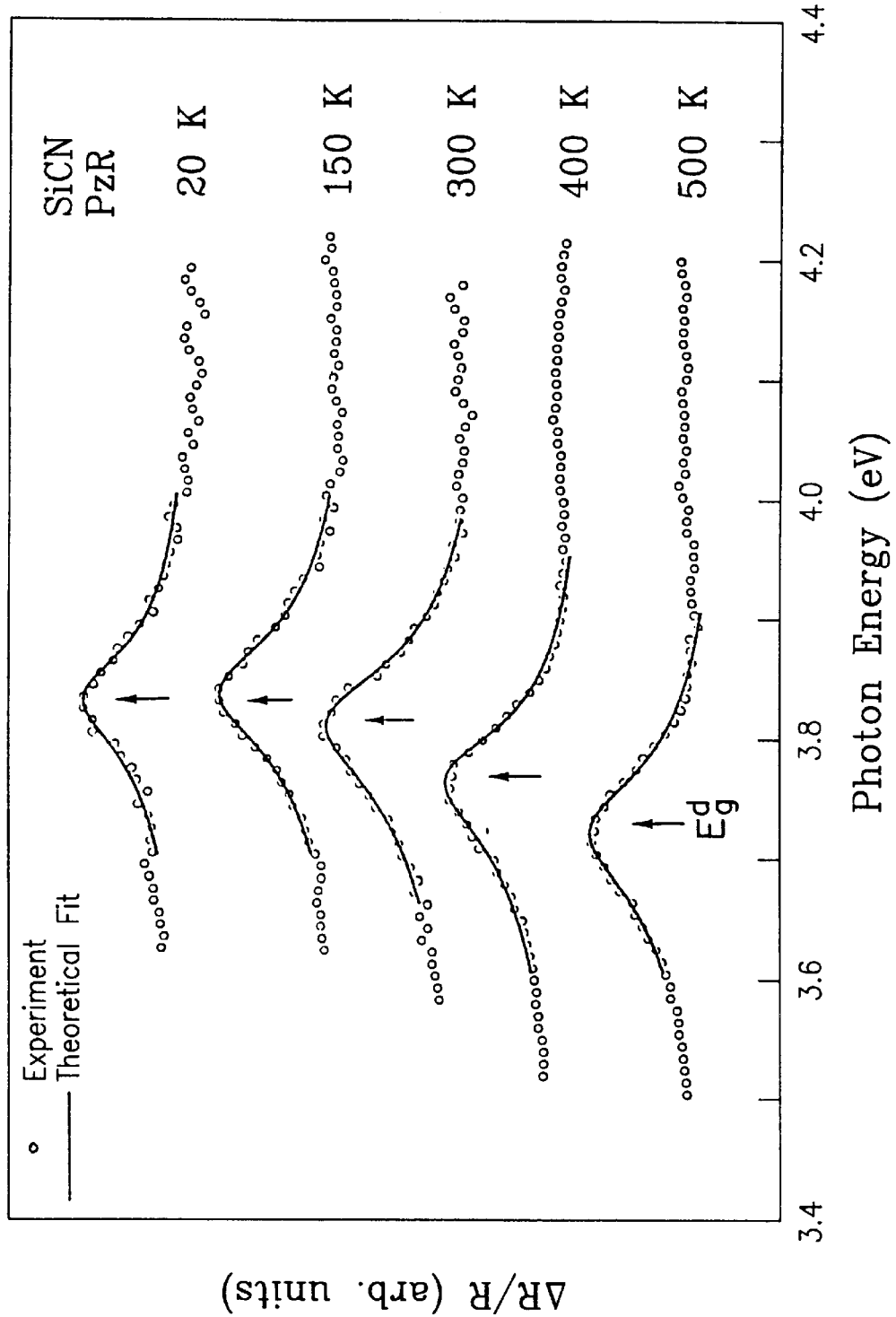

FIG. 7 is the The PzR spectra in the vicinity of the band gap ($Eg^d$) of $Si_xC_yN_z$ film at several temperatures between 20 and 500 K.

DETAILED DESCRIPTION OF THE PREFERRED EMBODIMENT

A method of forming a polycrystalline film of the said material onto crystalline silicon substrates comprises energizing a mixture of carbon, silicon and nitrogen containing gasses by means of coupling the same with a microwave resonant cavity, generating a microwave plasma thereby. Details of the above process for deposition of polycrystalline film of $Si_xC_yN_z$, such as the flow rates of respective gasses, total pressure in the chamber, temperature of the substrates, magnitude of the microwave power etc., as well as details of the chemical and structural characterizations of the resulting material, have been the subject of U.S. patent application Ser. No. 08/915,173, the entire disclosure of which is herein incorporated by reference. This application was filed in the United States Patent and Trademark Office on Aug. 20, 1997, by the inventors Chen et al., entitled "Crystalline $Si_xC_yN_z$ and Method for Synthesis of the Same" (our reference PB 86 0134).

A method for synthesis of polycrystalline thin films of said material onto crystalline Si substrates comprises energizing a mixture of carbon, silicon and nitrogen containing gasses, such as methane, silane and nitrogen, further diluted in hydrogen, at flow rates of 5–25, 0.4–0.8, 70–90 and 60–80 sccm respectively thereof, by means of coupling the same with a microwave resonant cavity, generating a microwave plasma thereby. The microwave power dissipated in the plasma should be at least sufficient to dissociate said gasses, typically between 1.0 to 3.5 KW. The total pressure in the deposition chamber may be 40 to 100 Torr. The aforementioned process also requires the Si substrates to be held at a temperature between 800 and 1200° C. for realizing the deposition of said material thereover. The aforementioned process also involves a process for cleaning the surface of Si substrates, comprising generation of a microwave plasma in pure hydrogen gas at a microwave power of 2 KW and a substrate temperature of about 800° C., prior to onset of the actual deposition process.

Notably, substrate temperature and fractions of silane and methane in the source gas ate the parameters that dedicate the form (amorphous or crystalline) of the resultant material. When the substrate temperatures is lower than 600° C., the deposited material is amorphous SiCN while for a substrate temperatures between 600°–800° C. the film consists of very fine grain SiCN crystallites (few hundred nanometers in size), irrespective of the source gas composition. At substratetemperatures between 800°–1000° C. and methane flow rates between 10–25 sccm, the deposited material is also amorphous SiCN for silane flow rates of less than 0.4 sccm, while it is crystalline SiCN at otherwise same deposition conditions but silane flow rates between 0.4–0.8 sccm. At substrate temperatures exceeding 1000° C., the material is again crystalline SiCN for silane flow rates between 0–0.8 sccm. For silane flow rates exceeding 0.8 sccm powder of amorphous silicon is principally formed irrespective of the substrate temperature. As for methane flow rates, crystalline SiCN is formed at flow rates between 5–25 sccm, above 25 sccm amorphous carbon is formed, while below 5 sccm silicon nitride is predominantly formed. It has to be noted here, though, that the boundaries between these various zones corresponding to the various phases of the deposited material are not very well defined and there is often a considerable overlap. The present invention, however, pertains only to the crystalline material formed and hence all the ensuing discussion pertains only to the crystalline phase, unless mentioned otherwise.

The scanning electron micrograph of a typical crystal, several tens of microns in dimension, of said material resulting from the aforementioned process is presented in FIG. 4. These crystals are rod-like in shape with an aspect ratio of about 5–10, and have a hexagonal cross-section. The crystals also have a higher cross sectional area somewhere in the middle than at the ends. For longer deposition runs, clusters comprising of a few crystallites or formation of continuous polycrystalline film (as shown in FIG. 5) of few millimeters in size occurs. The parameters that dictate the size of individual crystals are substrate temperature, silane fraction of the source gas and obviously the duration of deposition. Lower substrate temperatures and low silane flow rates result in deposition of smaller crystals. At a typical source gas composition of 20 sccm $CH_4$, 0.5 sccm $SiH_4$, 80 sccm $N_2$ and 80 sccm $H_2$, microwave power of 3.0 KW, substrate temperature of 1000° C. and deposition time of 24 hours, the deposited crystals are typically 50–60 $\mu$m long and 10–15 $\mu$m in thickness.

The chemical composition of the polycrystalline films resulting from the aforementioned process were assessed from the Auger electron spectra recorded on the Scanning Auger Nanoprobe system (Perkin Elmer, model No. PHI 670), capable of acquiring data from area as small as 500 A. This particular capability of the machine enabled use of probe size smaller than the size of individual crystals, thereby enabling determination of chemical composition of individual crystals and not merely the gross chemical composition over large are, i.e. averaged over several crystals. The Auger spectrometer was operated at electron beam energy of 5 KV and depth profiling was achieved by using Ar+ ion beam of energy 3–4 KV. The atomic sensitivity factors used for calculating the actual fractions of Si, C, N and O in the crystals were 0.14, 0.23, 0.28 and 0.4 respectively. The Auger electron spectra of individual crystal of said material yielded the chemical composition of said crystals to be in the range as —Si— 15–20 at. %, C-30-40 at. %, N-45-55 at. % and 0-1-2 at. % and the corresponding depth profiles confirmed that this composition remains roughly constant (variation of about 2–5 at. %) throughout the depth analyzed. Moreover, a closer examination of the fine structure of carbon Auger line reveals that the carbon atoms in these crystals are sp3-coordinated. It may be mentioned here that the chemical composition of the deposited material is sensitive mainly to the substrate temperature and the source gas composition. A significantly greater incorporation of Si occurs at substrate temperatures exceeding 1000° C. and at higher silane fractions in the source gas. It may also be noted here that the chemical composition of every individual crystal on the same substrate also varies over a small range of about 5 to 7 at. %. The chemical composition of the amorphous SiCN phase, on the other hand, was found to be C-50-55 at. %, Si-20-30 at. % and N-20-30 at. %.

The chemical bonding between Si, C and N in the aforementioned crystals was investigated by x-ray photoelectron spectroscopy (XPS). The XPS spectra were recorded on a VG Microtech MT-500 ESCA system. The Mg K $\alpha$ radiation of energy 1253.6 eV, with a line width of 0.7 eV, was employed as source and the typical pass energy was 20 eV. Curve fitting software (ESCA Tools) provided by Surface Interface was used to analyze the XPS data. The experimental uncertainty in determination of binding energy was about ±0.4 eV. The wide scan XPS spectra also indicating presence of Si, C, N and a negligible amount of O in the material. The narrow scan spectra of the Si(2p), C(1s) and N(1s) peaks revealed that all these peaks comprised of more than one Gaussian peaks, indicating multiple bonding structures between the constituent atoms Si, C and N. The Si(2p) photo-electron peaks could be resolved into three peaks centered at 99.2–99.9, 101.6–102.7 and 103.5–104.6 eV respectively. These peaks respectively belong to Si(2p)-Si, Si(2p)-N and Si(2p)-O bonding. The Si-Si peak is believed to originate from the Si substrate surface uncovered by the crystals and not derived from the crystals. Notably, there is no separate peak that matches the Si(2p)-C binding energy of 100.3 eV, thus suggesting absence of Si-C bonds in the concerned crystals.

The C(1s) photo-electron peak comprises of two components centered at 284.8–285.7 and 287.2–288.4 eV respectively, whereas the N(1s) peak also consists of two components centered at 397.5–398.5 and 399.5–400.6 eV respectively. Although the assignment of these C(1s) and N(1s) photo-electron peaks to some specific bonding structures is not as straightforward as those of Si(2p) peaks, the shift of C(1s) binding energy to a higher value compared to that of the C-C bond in diamond or graphite (284.5 eV) confirms the bonding of carbon with more electronegative nitrogen. Also, consistent with the Si(2p) peaks, the C(1s) peak does not show any separate peak at 283 eV corresponding to the C(1s)-Si bonding. Thus the presence of Si-C bonds in the concerned crystals is believed to be negligible. A comparison of this data with that reported by Marton et al. (Phys. Rev. Lett., 73,118(1994)) and Sjostrom et al. (Phys. Rev. Lett., 75,1336(1995)) confirms that the carbon atoms in these crystals are tetrahedrally coordinated and covalently bonded with nitrogen. The absence of Si-C bonds further suggest that the carbon atoms substitute only at the fourfold Si sites and vise versa, Si and C atoms therefore being always bridged by the N atoms. These findings, in conjunction with the aforementioned chemical composition of these crystals synthesized in the present invention consist of a predominantly carbon-nitride network.

The x-ray diffraction (XRD) spectra of the polycrystalline SiCN film consisted of many sharp lines (FIG. 1(A)), characteristic of crystalline material, while the XRD spectra of amorphous SiCN phase displayed only broad humps (FIG. 1(B)), characteristic of an amorphous material. Notably, the XRD spectra of crystalline films do not display any broad peaks, suggesting the absence of amorphous phase in the crystalline films. The presence of large number of sharp diffraction lines in these spectra further suggests a crystal structure with low symmetry. The d values (i.e. interplanar spacings), as obtained from the XRD spectra, do not match completely with those of either $\alpha$ or $\beta$ phases of both $Si_3N_4$ as well as $C_3N_4$. This is obvious since the present ternary alloy would have different lattice spacings even if it retains the same short range and long range orders of either ú\or ú]phases. One can, nevertheless, assume a certain stoichiometry and crystal structure or this material and calculate the corresponding lattice spacings and consequently index the observed diffraction peaks accordingly.

But possibility of the presence of more than one phases in the polycrystalline film does not guarantee that the results thus obtained would be unambiguous. Notably, recent theoretical studies have shown that as much as four different phases of carbon-nitride can exist as stable compounds only for the $C_3N_4$ stoichiometry. Moreover, there is also no reason to believe that $C_3N_4$ would be the only stable stoichiometry. In fact, recent experimental results have shown that $C_2N$ is a more stable phase than $C_3N_4$ (Zhang et al., Appl. Phys. Lett., 68,2639(1996)). In addition to this difficulty, variations in chemical composition of individual crystals in the present polycrystalline films, as observed by Scanning Auger studies, further complicate the analysis of diffraction spectra. Thus, unambiguous identification of the structure of the present SiCN crystals has not been possible by x-ray diffraction studies. Transmission electron microscopy (TEM) was then employed to investigate the structure of this new crystalline material. Since this technique probes the structure of individual crystal, as opposed to XRD which is a bulk technique, these studies were expected to reveal whether multiple phases are present. These investigations were performed using Hitachi H-7100 microscope at an operating voltage of 75 KV. The specimen were prepared by scrapping and grinding the film, suspending the resulting fragments in methyl alcohol and finally depositing the suspension onto Cu grid. These investigations revealed the presence of two different microstructures, one giving single crystal diffraction pattern while the other giving powder diffraction pattern. The volume fraction of the specimen that gives powder diffraction pattern was less than 10%. Since the samples for these studies were prepared by scrapping and grinding the film, the information pertaining to relative position of these specimen in the film was lost.

We however believe that the fine grained polycrystalline material lies only at the interface since the SEM micrographs are overwhelmed by large grain crystals. The typical transmission electron diffraction pattern obtained from one of the large grain crystals is presented in FIG. 6. As should be expected, the lattice spacing obtained from this diffraction pattern do not match completely with those of either α or β phases of both $Si_3N_4$ or $C_3N_4$. However, since the electron diffraction patterns for these crystals suggest a hexagonal structure, the lattice parameters a and c(as conventionally defined for hexagonal structures) can be calculated. Such hexagonal structure is consistent with the morphology observed from the SEM micrographs. The preliminary estimates of the magnitudes of lattice parameters a and c are 5.4 and 6.7 a respectively. Consistent with the observed variations in the chemical composition of individual crystals, a variation of ±10% in the values of these parameters are observed from crystal to crystal. The fact that lattice parameter c is much larger than a suggests that these crystals possess a hexagonal structure with large number of atoms per unit cell. It may be noted here that β phase of the $Si_3N_4$ contains larger number of atoms per unit cell than the a phase. The volume of unit cell of $Si_xC_yN_z$ crystals, as estimated from the above diffraction data, is between the cell volumes of α-$Si_3N_4$ and α-$C_3N_4$. Moreover, the magnitude of the a and c parameters would be much different for the β phase. The TEM results thus suggest that the present SiCN crystal may have structure close to that of α-$Si_3N_4$.

Further support to this conclusion can be sought from the following Raman scattering and infrared (ir) absorption studies. The Raman and ir absorption spectra of both the $Si_3N_4$ phase are well known. Although the Raman and ir absorption frequencies for either of the $C_3N_4$ phases have not been theoretically calculated so far, one can nevertheless obtain these been theoretically calculated so far, one can nevertheless obtain these frequencies by properly scaling the corresponding $Si_3N_4$ spectra, assuming the crystal structure to be identical. The scaling factor can be estimated from the ratios of bulk modulus and bond lengths between $Si_3N_4$ and $C_3N_4$ by using the Hooks law approximation as —

$$\frac{W_{CN}}{W_{SiN}} = \left[\frac{B_{CN} d_{CN} \mu_{SiN}}{B_{SiN} d_{SiN} \mu_{CN}}\right]^{1/2}$$

where ω is the vibrational frequency, B is the bulk modulus, d is the bond length and $\mu$ is the reduced mass of the respective materials.

It is clear that the magnitude of scaling factor depends on C-N bond length and bulk modulus of $C_3N_4$, for which only theoretical estimations are available. Although there is a unanimity between various theoretical studies regarding the C-N bond length, the theoretical estimates of bulk modulus vary widely. For instance, Liu and Cohen (Phys. Rev. B, 42,10727(1990)) estimated the bulk modulus of $C_3N_4$ to be comparable to that of diamond, Guo and Goddardó (Chem. Phys. Lett., 237,72(1995)) suggested a value merely half of it. As a result, the scaling factor is 1.44 and 0.91 from the respective results. This large discrepancy in the magnitude of bulk modulus between said two studies has resulted only from the different assumptions considered in these studies. Clearly, the real bulk modulus could be anywhere between these two magnitudes.

Figure 2B:
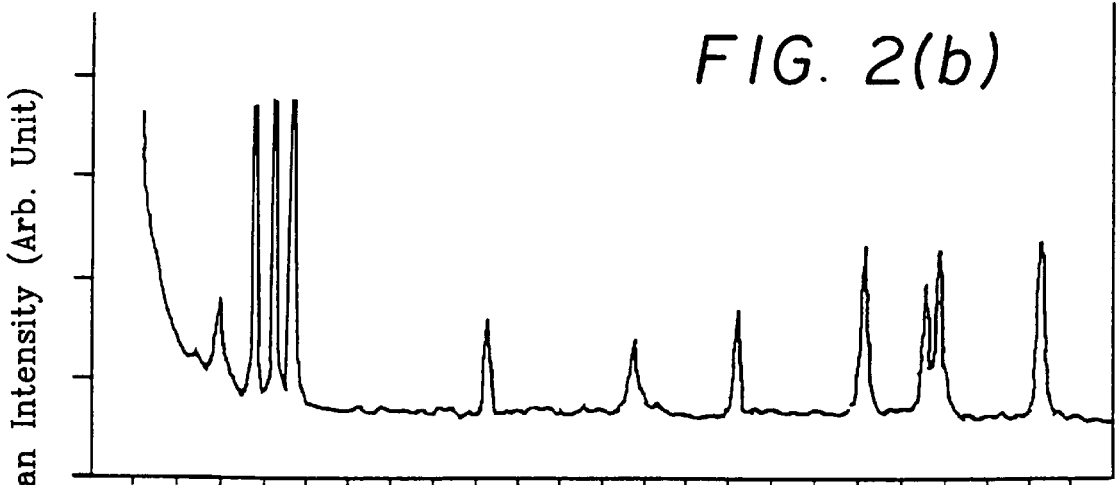
Figure 2C:
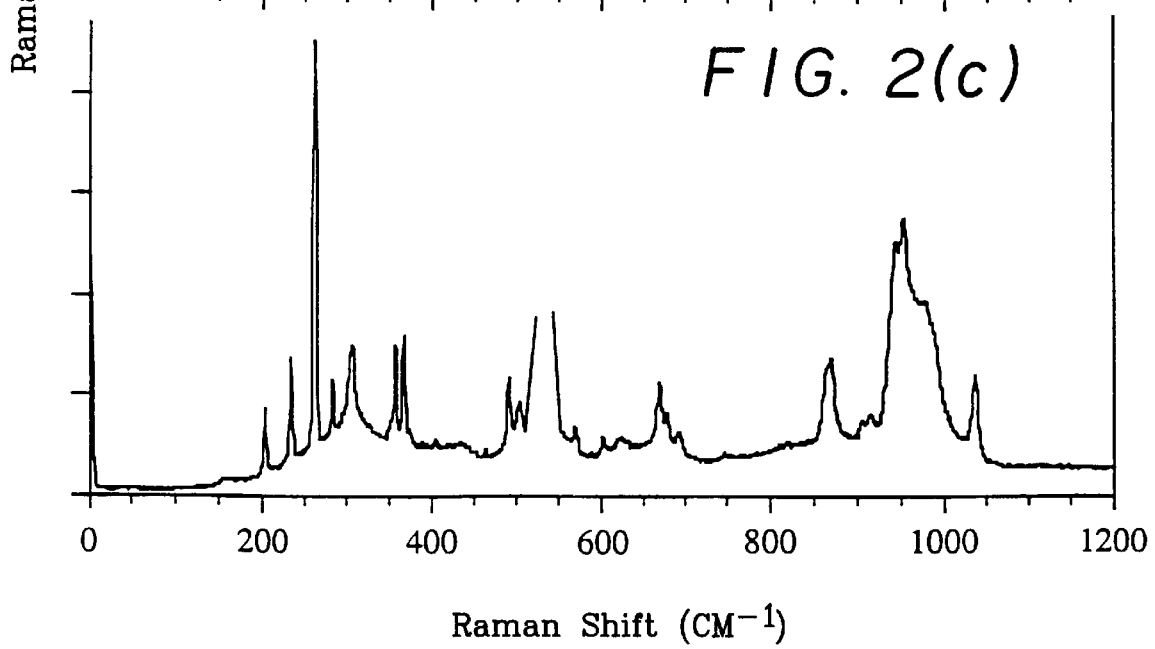

The Raman spectra of β-$Si_3N_4$, α-$Si_3N_4$ and the present SiCN crystals are presented in FIGS. 2 (a), (b) and (c) respectively, whereas the ir absorption spectra of the respective materials are presented in FIGS. 3 (a), (b) and (c). It can be noted that both Raman as well as ir spectra of the present SiCN material are similar to those of a-$Si_3N_4$ and are much different from those of β-$Si_3N_4$. Notably, most of the Raman as well as ir vibrational frequencies of SiCN match quite nicely with those of α-$Si_3N_4$ (see Table 1 and 2), although their relative intensities differ. Such similarity in the Raman and ir vibrational frequencies between α-$Si_3N_4$ and SiCN can result only from the exact similarity in the structural short range order between these two materials. The relative intensities, on the other hand, would vary due to the modification of coupling constants of various vibrational modes, brought about by the presence of a significant of carbon in the SiCN crystals compared to α-$Si_3N_4$. These spectra thus provide additional evidence for the structural short range order in the present SiCN crystals to be similar to that in α-$Si_3N_4$. The matching between Raman and ir vibrational frequencies of these two materials further suggests that the actual scaling factor between α-$Si_3N_4$ and SiCN, based on bond lengths, bulk modulus and reduced mass, is close to unity.

It is thus concluded that the present invention provides a novel crystalline material $Si_xC_yN_z$ with a probable stoichiometry of (Si;C)3N4 and possesses a structure similar to that of ú- Si3N4. The present invention also provides a method for synthesis of the aforementioned material.

The optical properties of the said material were studied by using the technique of piezoreflectance (PzR), which has been proven to be useful towards investigation and characterization of various semiconductors[2,3]. The measurements were performed with monochromatic light, with a spot size of about 1 mm, at several temperatures between 500 K and 20 K for determining the temperature dependence of variations in the optical parameters. From the detailed lineshape fitting of the experimental data, temperature dependence of the optical band gap and the broadening parameter of the direct band to band transitions in the material have been accurately determined.

The PzR spectra in the vicinity of the band gap ($E_g^d$) of $Si_xC_yN_z$ film, at several temperatures between 20 and 500 K, are displayed in FIG. 1. The experimental lineshape was fitted to the function:

$$\Delta R/R = Re\{Ae^{i\Phi}(\Delta\epsilon_1 + i\Delta\epsilon_2)\} \quad (1)$$

where A and $\Phi$ are the amplitude and phase of the feature, $\Delta\epsilon_1$ and $\Delta\epsilon_2$ are the induced changes in the real and imaginary parts of the dielectric function $\epsilon$, due to modulation of the external stress. For interband transitions, the first derivative of the dielectric function near the $M_0$ type of three-dimensional critical point is given by $$\frac{d\varepsilon_1}{dE} = -\frac{d\varepsilon_1}{dE_g^d} \propto \frac{1}{2}\Gamma_o^{-1/2}F(-x), \frac{d\varepsilon_1}{d\Gamma_o} \propto \frac{-1}{2}\Gamma_o^{-1/2}F(x) \quad (2a)$$

and $$\int \frac{d\varepsilon_2}{dE_g} = -\frac{d\varepsilon_2}{dE^d} \propto \frac{1}{2}\Gamma_o^{-1/2}F(x), \frac{d\varepsilon_2}{d\Gamma_o} \propto \frac{1}{2}\Gamma_o^{-1/2}F(-x) \quad (2b)$$

where $F(x) = (x^2+1)^{-1/2}[(x^2+1)^{1/2}+x]^{1/2}$ with $x = (E-Eg^d)/\Gamma_o$ and $\Gamma_o$ is the broadening parameter of the band gap. The least square fits to Eq.(1) are shown by solid curves in FIG. 1. These fits yield the magnitudes of the parameters $Eg^d$ and $\Gamma_o$. The values of band gap thus obtained are indicated by arrows in the figure. It can be seen that the direct band gap of $Si_xC_yN_z$ is 3.8 eV at 300 K.

Many changes and modifications in the above described embodiment of the invention can, of course, be carried out without departing from the scope thereof Accordingly, to promote the progress in science and the useful arts, the invention is disclosed and is intended to be limited only by the scope of the appended claims.

REFERENCES

1. U.S. patent application Ser. No. 08/915,173, by L. C. Chen et al., approved by the National Science Council of the Republic of China (our reference: PB 86 0134).
2. F. H. Pollak and H. Shen, Mater. Sci. Engg. R10, 275 (1993)
3. H. Mathieu, J. ALLegre and B. Gil, Phys. Rev. B 43, 2218(1991)

What is claimed is:

1. A ternary $Si_xC_yN_z$ crystalline compound comprising a predominantly carbon-nitride network comprising $sp^3$-bonded silicon and carbon atoms and $sp^2$-bonded N atoms and having a direct optical band gap of 3.8 eV and wherein x is 15–20 at. %, y is 30–40 at. % and z is 45–55 at. %.

2. The crystalline material of claim 1 having a x-ray detraction spectra as shown in FIG. 1 (A).

3. The crystalline material of claim 1, wherein the crystals are rod-shaped and have an aspect ratio of 5–10.

4. The crystalline material of claim 1, wherein the crystals are 50–60 $\mu$m long and 10–15 $\mu$m in thickness.

5. A blue light emitting diode containing the crystalline material of claim 1.

6. A blue light emitting diode containing the crystalline material of claim 2.

7. A blue light emitting diode containing the crystalline material of claim 3.

8. A blue light emitting diode containing the crystalline material of claim 4.

9. A laser diode containing the crystalline material of claim 1.

10. A laser diode containing the crystalline material of claim 2.

11. A laser diode containing the crystalline material of claim 3.

12. A laser diode containing the crystalline material of claim 4.

* * * * *